(12) United States Patent
Chen et al.

(10) Patent No.: US 9,281,234 B2
(45) Date of Patent: Mar. 8, 2016

(54) WLCSP INTERCONNECT APPARATUS AND METHOD

(71) Applicant: Taiwan Semiconductor Manufacturing Company, Ltd., Hsin-Chu (TW)

(72) Inventors: Jie Chen, New Taipei (TW); Hsien-Wei Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 22 days.

(21) Appl. No.: 13/892,685

(22) Filed: May 13, 2013

(65) Prior Publication Data

US 2014/0264884 A1  Sep. 18, 2014

Related U.S. Application Data

(60) Provisional application No. 61/778,327, filed on Mar. 12, 2013.

(51) Int. Cl.
| | | |
|---|---|---|
| *H01L 23/48* | (2006.01) | |
| *H01L 21/768* | (2006.01) | |
| *H01L 23/31* | (2006.01) | |
| *H01L 23/525* | (2006.01) | |

(52) U.S. Cl.
CPC ...... *H01L 21/76802* (2013.01); *H01L 23/3114* (2013.01); *H01L 23/525* (2013.01); *H01L 2224/13* (2013.01)

(58) Field of Classification Search
None
See application file for complete search history.

(56) References Cited

U.S. PATENT DOCUMENTS

| | | | | |
|---|---|---|---|---|
| 8,035,226 | B1 * | 10/2011 | Wilcoxen et al. | 257/738 |
| 2005/0017343 | A1 * | 1/2005 | Kwon et al. | 257/698 |
| 2009/0294958 | A1 * | 12/2009 | Hu | 257/737 |
| 2010/0096754 | A1 * | 4/2010 | Lee et al. | 257/738 |

\* cited by examiner

*Primary Examiner* — Daniel Whalen
(74) *Attorney, Agent, or Firm* — Slater & Matsil, L.L.P.

(57) ABSTRACT

Disclosed herein is an interconnect apparatus comprising a substrate having a land disposed thereon and a passivation layer disposed over the substrate and over a portion of the land. An insulation layer is disposed over the substrate and has an opening disposed over at least a portion of the land. A conductive layer is disposed over a portion of the passivation layer and in electrical contact with the land. The conductive layer has a portion extending over at least a portion of the insulation layer. The conductive layer comprises a contact portion disposed over at least a portion of the land. The insulation layer avoids extending between the land and the contact portion. A protective layer may be disposed over at least a portion of the conductive layer and may optionally have a thickness of at least 7 μm.

16 Claims, 7 Drawing Sheets

WLCSP INTERCONNECT APPARATUS AND METHOD

CROSS REFERENCE TO RELATED APPLICATIONS

This application claims the benefit of priority to U.S. Provisional Application Ser. No. 61/778,327, filed on Mar. 12, 2013, entitled "WLCSP Interconnect Apparatus and Method," which application is hereby incorporated by reference herein.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductor layers of material over a semiconductor substrate, and patterning the various material layers using lithography to form circuit components and elements thereon.

Interconnects may be formed to join two substrates. An array of interconnects may be deposited on the bonding pads of a first substrate, with a second substrate joined at its own bonding pad sites to the first substrate via the interconnects. For example, interconnects may be solder balls formed on a pad and then reflowed to attach a second substrate. The interconnects may be formed with a layout different from the land layout to permit customization of the output layout. This may be accomplished with metal lines disposed in a dielectric, with one or more metal layers overlying the lands and connected to the lands by conductive plating layers.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to illustrate the relevant aspects of the embodiments and are not necessarily drawn to scale.

DETAILED DESCRIPTION

The making and using of the presented embodiments are discussed in detail below. It should be appreciated, however, that the present disclosure provides many applicable concepts that can be embodied in a wide variety of specific contexts. The specific embodiments discussed are merely illustrative of specific ways to make and use the described conductive post-passivation interconnect (PPI) for a wafer level chip scale package (WLCSP) structure and do not limit the scope of the disclosure.

Embodiments will be described with respect to a specific context, namely making and using interconnects useful in, for example, PPI structures in WLCSP assemblies. Other embodiments may also be applied, however, to other electrically connected components, including, but not limited to, package-on-package assemblies, die-to-die assemblies, wafer-to-wafer assemblies, die-to-substrate assemblies, in assembling packaging, in processing substrates, interposers, substrates, or the like, or mounting input components, boards, dies or other components, or for connection packaging or mounting combinations of any type of integrated circuit or electrical component.

The embodiments of the present disclosure are described with reference to FIGS. 1 through 10, and variations of the embodiments are also discussed. Throughout the various views and illustrative embodiments of the present disclosure, like reference numbers are used to designate like elements. Additionally, the drawings are intended to be illustrative, are not to scale and not intended to be limiting. Note that, for simplification, not all element numbers are included in each subsequent drawing. Rather, the element numbers most pertinent to the description of each drawing are included in each of the drawings.

Figure 1:
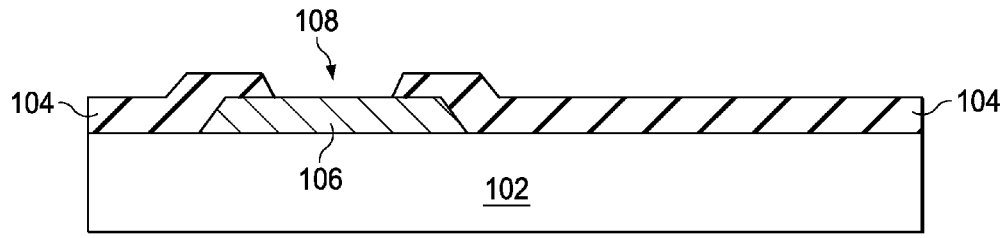
FIGS. 1 through 6 illustrate cross-sectional views of intermediate steps in forming an interconnect according to an embodiment.

FIG. 1 is a cross-sectional view illustrating a substrate 102 with a land 106 for according to an embodiment. A substrate 102 such as a wafer, chip, die, package or other carrier may have a conductive land 106 disposed therein. A passivation layer 104 may be disposed on the substrate 102 and a portion of the land 106. The passivation layer 104 may have an opening 108, exposing a portion of the land 106 to allow deposition of subsequent layers on the land 106.

The substrate 102 may have one or more active devices formed thereon, and the land 106 may be electrically connected to one of the active devices. For example, the substrate 102 may be a processor die of a wafer, and the land 106 may connect to one or more transistors of the processor core to act as an output for the processor. Additionally, while not shown, the substrate 102 may comprise one or more interlayer dielectric layers, intermetal layers, insulator layers, redistribution layers or any other suitable substrate layer.

In one embodiment, the land 106 may be aluminum (Al), but may, in other embodiments, may be polysilicon, gold (Au), copper (Cu), tantalum (Ta), tungsten (W), silver (Ag), palladium (Pd), other suitable conductive material or compound or combinations thereof. The land 106 may be formed with a thickness between about 1 μm and about 3 μm and with a width or length greater than about 2 μm. A passivation layer 104 may be formed over the surface of the substrate to passivate the components of the substrate 102, electrically insulating component structures and preventing oxidation or other chemical reactions from degrading performance of the components. The passivation layer 104 may have an opening exposing the land 106, permitting electrical contact with subsequent layers. In an embodiment, the passivation layer 104 may a substantially conformal layer and may be an oxide or nitride such as silicon dioxide ($SiO_2$) or silicon nitride (SiN) or another material such as silicon carbide (SiC), titanium nitride (TiN) or the like. In an embodiment, the passivation layer 104 may be formed with a thickness between about 0.5 μm and about 3 μm.

One or more coating layers (not shown) may optionally be formed to cover and protect the surface of the land 106. The coating layers may provide protection against corrosion, oxidation or contaminants of the land 106 and a stronger bond for a subsequently bonded structure. In an embodiment, the one or more coating layers may be electroless plated layers such as an electroless nickel electroless palladium (ENEP) layer. The coating layer, may, in an embodiment, be an organic solder preservative (OSP), another metallic coating, such as an electroplated coating, or the like.

Figure 2:
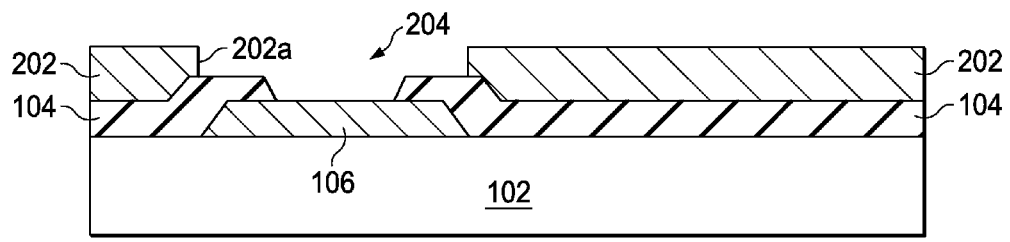

FIG. 2 is a cross-sectional view illustrating application of an insulation layer 202 according to an embodiment. The insulation layer 202 may be formed over the passivation layer 104 and with an opening 204 over at least a portion of the land 106. In an embodiment, the insulation layer 202 may be formed with opening sidewalls 202a substantially aligned with the edges of the land 106. In another embodiment, the opening sidewalls 202a may be aligned over the body of the land 106, or may be aligned outside the land 106 such that the insulation layer 202 avoids being aligned over the land 106.

The insulation layer 202 may be formed by deposition and patterning. For example, in an embodiment, the insulation layer 202 may be formed as a blanket layer and then etched or otherwise patterned to create the opening 204. In another example, a mask may be formed and insulation layer 202 deposited over the mask to pattern the insulation layer 202 using a damascene process.

The insulation layer 202 may have a thickness dependent on the application, and in an embodiment, the insulation layer 202 may be formed with a thickness between about 7 μm and about 10 μm. The insulation layer 202 may be an oxide or nitride or may be a polymer such as a polyimide, polybenzoxazole (PBO), benzocyclobutene (BCB), an epoxy, liquid molding compound, or the like. The insulation layer 202 may provide insulation for the underlying layer and prevent parasitic capacitance or interference between conductive structures in the substrate or overlying the insulation layer 202. The insulation layer 202 may be formed from a material having a high-k dielectric, and in an embodiment, may have a k-value of about 2.9 or higher.

Figure 3:
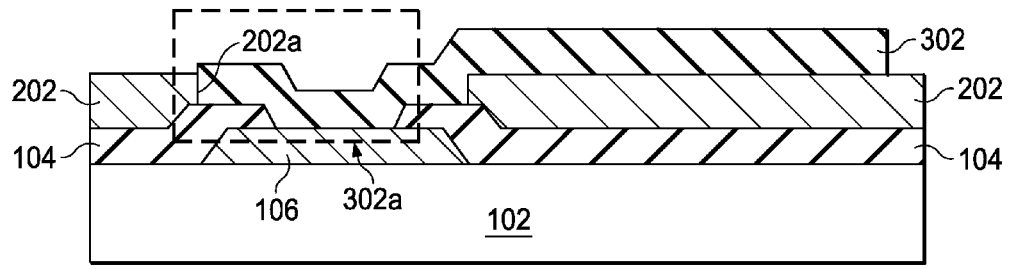

FIG. 3 illustrates formation of a post-passivation interconnect (PPI) layer 302 according to an embodiment. In an embodiment, the PPI layer 302 may be a conductive layer, such as a metal layer, formed to extend from the land to a region over the insulation layer 202 and non-aligned with the land 106. The PPI layer 302 may have a mounting pad, land, or other structure for mounting an interconnect (502, FIG. 5).

The PPI layer 302 may be formed by blanket deposition of a metal layer and subsequent masking and etching of the metal layer. The PPI layer 302 may also be formed by depositing a mask and then depositing a metal in the mask openings to form a patterned PPI layer 302. The PPI layer 302 may be formed with a thickness between about 4 μm and about 10 μm. In an embodiment, the PPI layer 302 may be copper or another conductive material, such as gold, aluminum, silver, tungsten, palladium, or another metal, alloy or the like. The PPI layer 302 may be deposited via a vapor deposition method such as molecular beam epitaxy (MBE), chemical vapor deposition (CVD) or plasma enhanced CVD (PECVD), or by electroplating, atomic layer deposition (ALD), or the like. Forming the PPI layer 302 may also comprise forming an initial barrier layer, seed layer or the like, and forming the PPI layer 302 over the initial layer. In such an embodiment, the seed layer may be formed, then a mask applied, and the PPI layer 302 deposited via electroplating. The mask and any excess seed layer may be subsequently removed.

The PPI layer 302 may have a PPI contact portion 302a, and the PPI contact portion 302a may have at least a portion in contact with the land 106. The PPI contact portion 302a may have a width or length greater than about 10 μm. The PPI contact portion 302a may lie on the land 106 and on the passivation layer 104 while avoiding overlying the insulation layer 202. In an embodiment, the PPI contact portion 302a may have a portion in direct contact with the passivation layer 104, and the PPI contact portion 302a has no insulation layer 202 disposed between the PPI contact portion 302a and the land. It is believed that forming the PPI layer 302 such that the insulation layer 202 avoids extending between the PPI layer 302 and land 106 permits overlying layers to be formed with greater thickness without increasing the overall thickness of the device. The increased thickness of the overlying layers may contribute to stronger overlying layers, resulting in fewer mechanical failures and greater device reliability.

In an embodiment, the sidewalls of the PPI contact portion 302a may contact the opening sidewalls 202a of the insulation layer 202. In such an embodiment, and where the opening sidewalls 202a are aligned over the edge of the land 106, the sidewalls of the PPI contact portion 302a may be substantially aligned over the edge of the land 106. In an embodiment, the overlay of the opening sidewalls 202a and the edge of the land 106 is about 0.1 um to 2 um. In another embodiment, the sidewalls of the PPI contact portion 302a may be separate from the opening sidewalls 202a, and may be disposed outside or past the edge of the land 106, or may be disposed over the body of the land 106.

Figure 4:
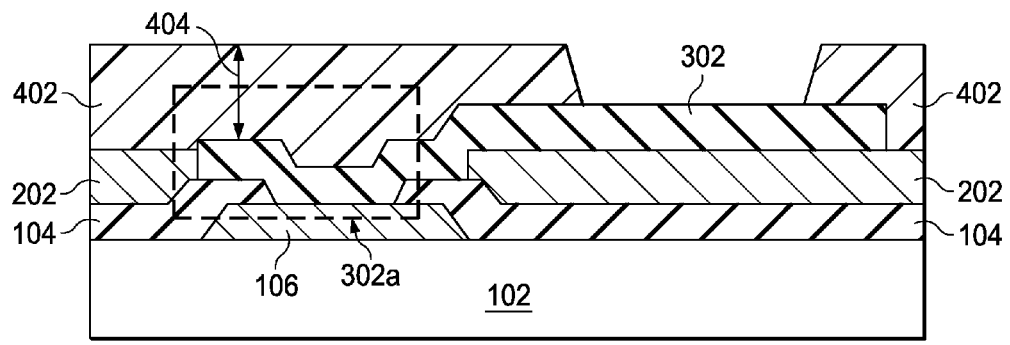

FIG. 4 is a cross-sectional view illustrating application of a protective layer 402. In one embodiment, the protective layer 402 may be a nonconductive material, such as an oxide, or nitride or may be a polymer such as a polyimide, a polybenzoxazole (PBO), benzocyclobutene (BCB), an epoxy, liquid molding compound, a resin, a moldable polymer, or the like, and may be a material different or the same as the insulation layer 202. In an embodiment, the protective layer 402 may be disposed over the PPI layer 302 and may have an opening exposing a portion of the PPI layer 302 for mounting of an interconnect (502, FIG. 5).

The protective layer may have a thickness 404 over the PPI contact portion 302a greater than about 7.0 μm, and in an embodiment, the thickness will be about 8.5 μm. It is believed that such a thickness reduces the susceptibility of the protective layer 402 to cracking or mechanical failure in a region where the PPI contact portion 302a is adjacent to the insulation layer 202.

Figure 5:
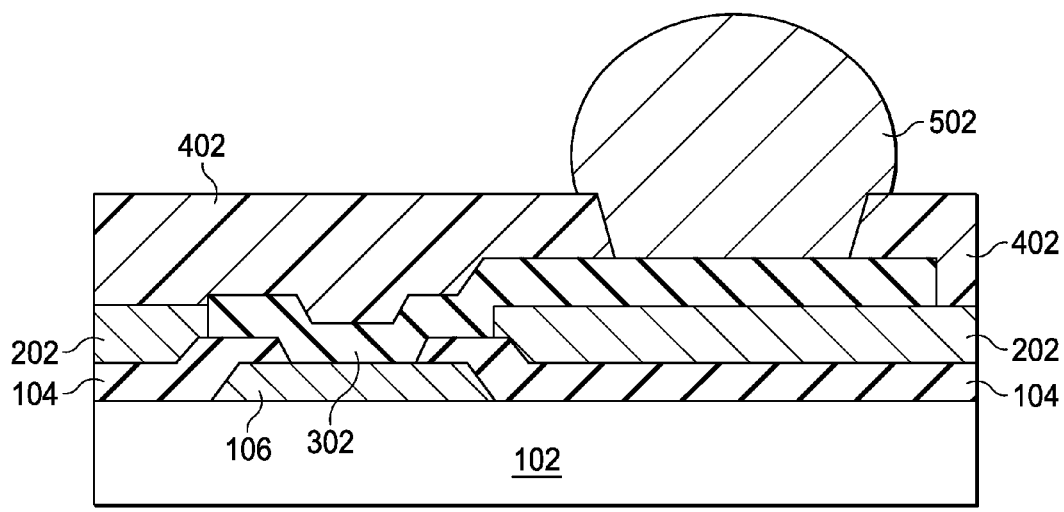

FIG. 5 is a cross-sectional view illustrating mounting of an interconnect 502. In an embodiment an interconnect 502 may be applied to the PPI layer 302. The interconnect 502 may be a metal such as solder, but may also be another metal, such as gold, copper, aluminum, lead (Pb), silver, tungsten, tin (Sn), or another metal or alloy. In another embodiment, the interconnect 502 may be a conductive material such as solder paste, a conductive epoxy or polymer. The interconnect 502 may also be applied to the PPI layer 302 so that the interconnect 502 avoids the land 106, or is adjacent to, and non-aligned with, the land 106. In such an embodiment, the interconnect 502 being non-aligned with the land 106 may permit an array of interconnects 502 to have a layout different from the layout of a plurality of lands 106.

Figure 6:
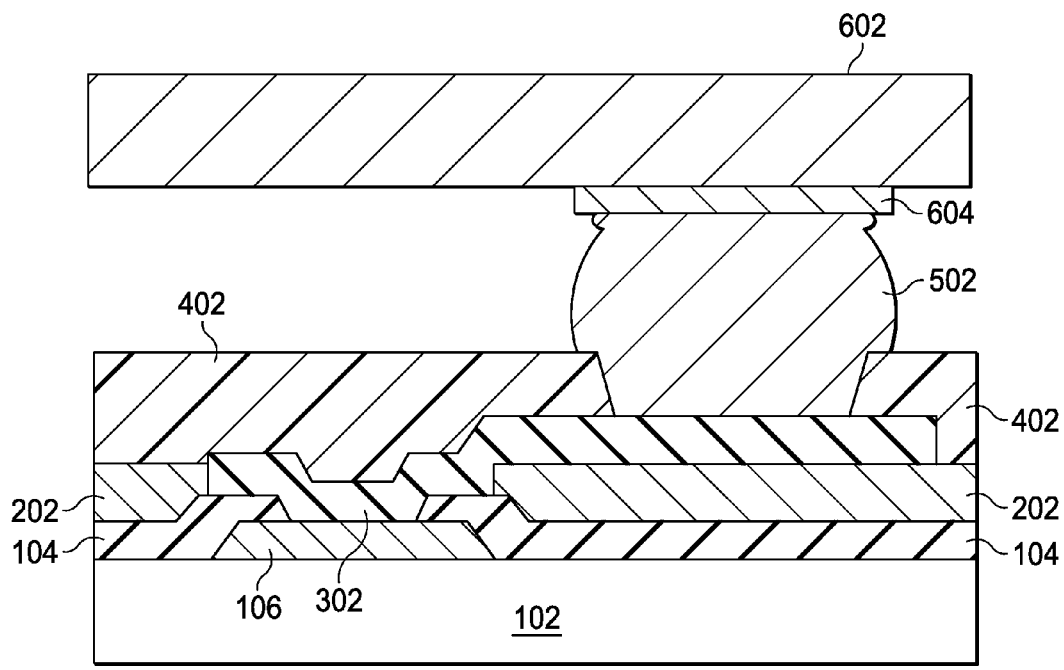

FIG. 6 is a cross-sectional view illustrating mounting of a second substrate 602 on the interconnect 502. The second substrate 602 may be mounted and the interconnect 502 activated to attach to the second substrate 602 thereby forming an electrical connection between the first substrate 102 and the second substrate 602. In one embodiment, the second substrate 602 may have lands 604, which may be joined to the interconnect 502. In an embodiment, the second substrate 602 may be a wafer, die, chip, interposer, another electrical component or the like.

Figure 7A:
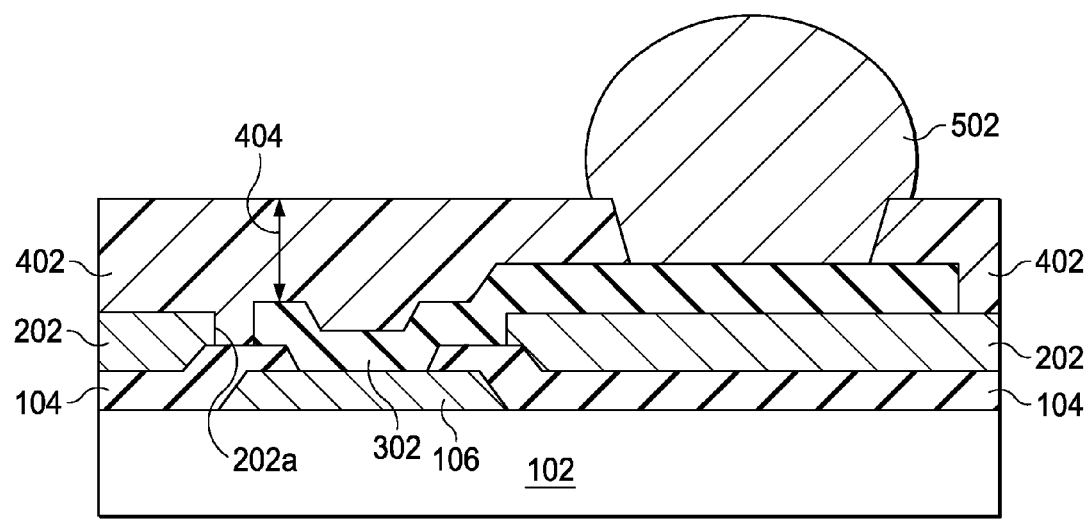
FIGS. 7A through 10B illustrate various embodiments of an interconnect structure.
Figure 7B:
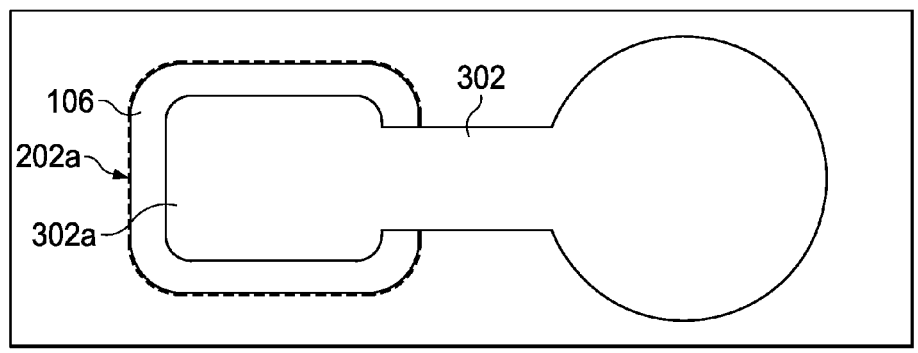

FIG. 7A is a cross sectional view, and FIG. 7B is a top view, of an interconnect according to an embodiment where the insulation layer 202 is separated from the PPI contact portion 302a. In an embodiment, the sidewall 202a of the insulation layer 202 may be aligned over the edge of the land 106, and the sidewall of the PPI contact portion 302a may be spaced apart from the sidewall 202a of the insulation layer 202 and aligned substantially over the body of the land 106. In such an embodiment, the opening of the insulation layer 202 may be about the same size as the land 106, while the PPI contact portion 302a is smaller than the land 106. In an embodiment, the sidewall of the PPI contact portion 302a is spaced apart from the sidewall 202a of the insulation layer 202 by a distance between about 0.1 µm and about 20 µm, and in an embodiment, by a distance between about 2 µm and about 10 µm.

Figure 8A:
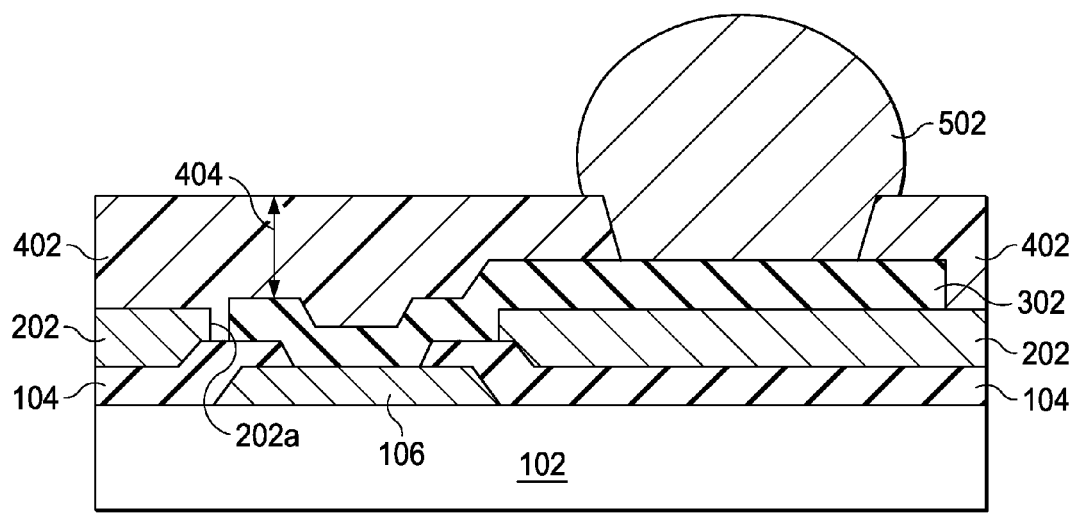
Figure 8B:
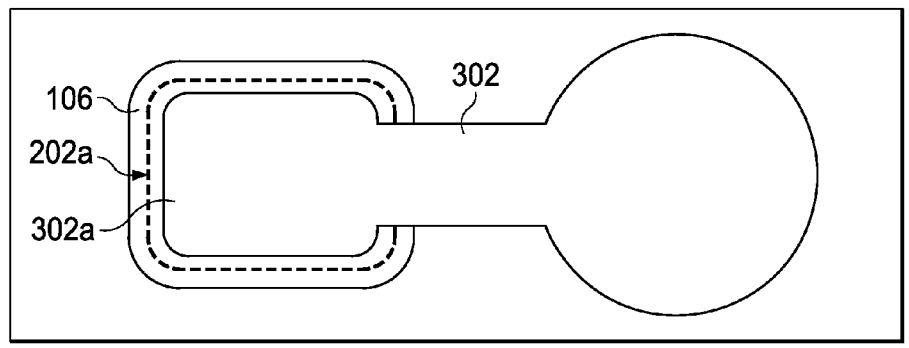

FIG. 8A is a cross sectional view, and FIG. 8B is a top view, of an interconnect according to an embodiment where the sidewall insulation layer 202 is separated from the PPI contact portion 302a. In an embodiment, the sidewall 202a of the insulation layer 202 and the sidewall of the PPI contact portion 302a may be spaced apart and may both be aligned substantially over the body of the land 106. In such an embodiment, the PPI contact portion 302a and the opening in the insulation layer 202 may be smaller than the land 106. In an embodiment, the sidewall of the PPI contact portion 302a is spaced apart from the sidewall 202a of the insulation layer 202 by a distance between about 0.1 µm and about 20 µm, and in an embodiment, by a distance between about 2 µm and about 10 µm.

Figure 9A:
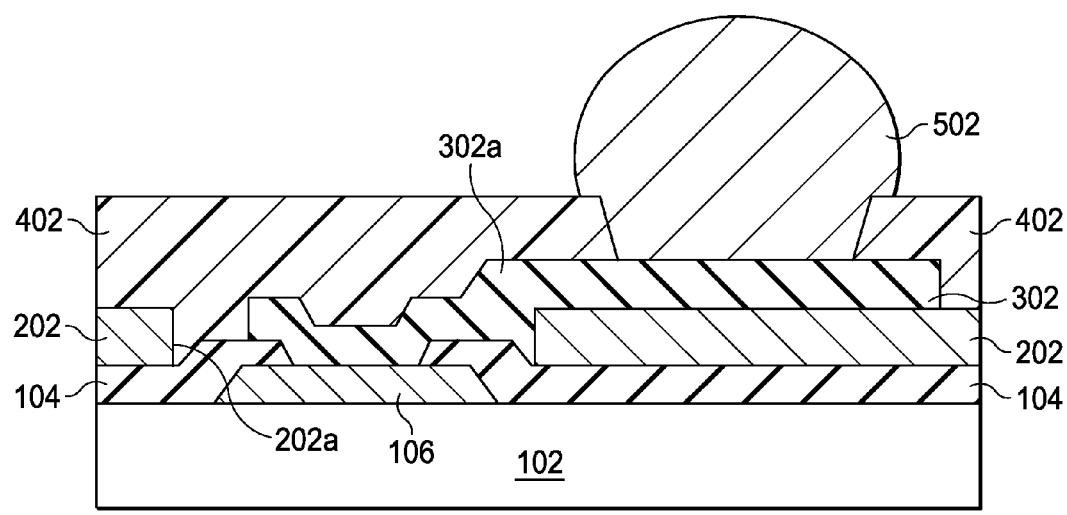
Figure 9B:
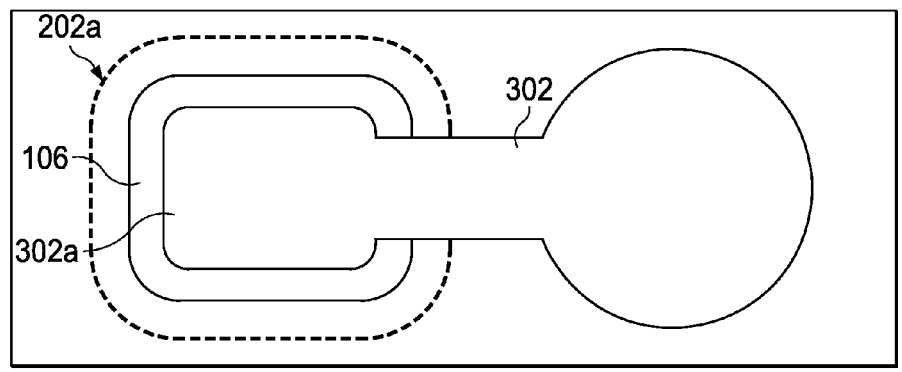

FIG. 9A is a cross sectional view, and FIG. 9B is a top view, of an interconnect according to an embodiment where the sidewall insulation layer 202 is separated from the PPI contact portion 302a. In an embodiment, the sidewall 202a of the insulation layer 202 may be aligned outside or past the edge of the land 106. The sidewall of the PPI contact portion 302a may be spaced apart from the sidewall 202a of the insulation layer 202 and aligned substantially over the body of the land. In such an embodiment, the PPI contact portion 302a may be smaller than the land 106, while the opening in the insulation layer 202 is larger than the land 106. In an embodiment, the sidewall of the PPI contact portion 302a is spaced apart from the sidewall 202a of the insulation layer 202 by a distance between about 1 µm and about 30 µm, and in an embodiment, by a distance between about 2 µm and about 10 µm.

Figure 10A:
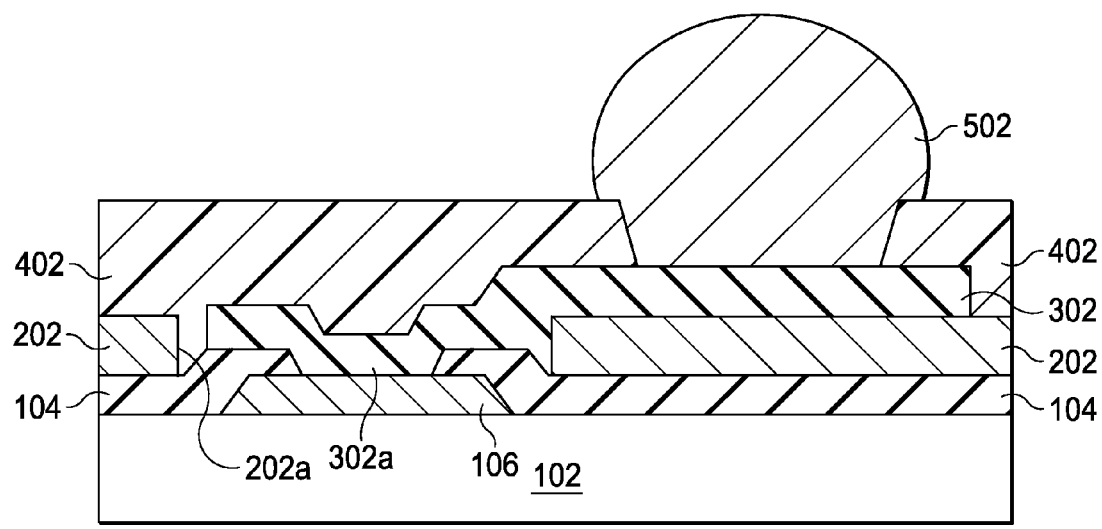
Figure 10B:
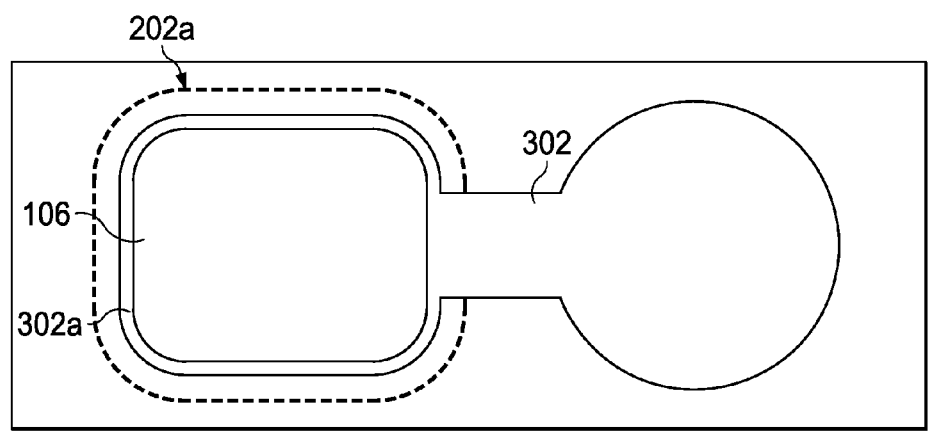

FIG. 10A is a cross sectional view, and FIG. 10B is a top view, of an interconnect according to an embodiment where the sidewall insulation layer 202 is separated from the PPI contact portion 302a. In an embodiment, the sidewall 202a of the insulation layer 202 and the sidewall of the PPI contact portion 302a may be spaced apart and may both be aligned substantially past, or outside, the edge of the land 106. In such an embodiment, the PPI contact portion 302a and the opening in the insulation layer 202 may be larger than the land 106. In an embodiment, the sidewall of the PPI contact portion 302a is spaced apart from the sidewall 202a of the insulation layer 202 by a distance between about 1 µm and about 30 µm, and in an embodiment, by a distance between about 2 µm and about 10 µm.

Figure 11:
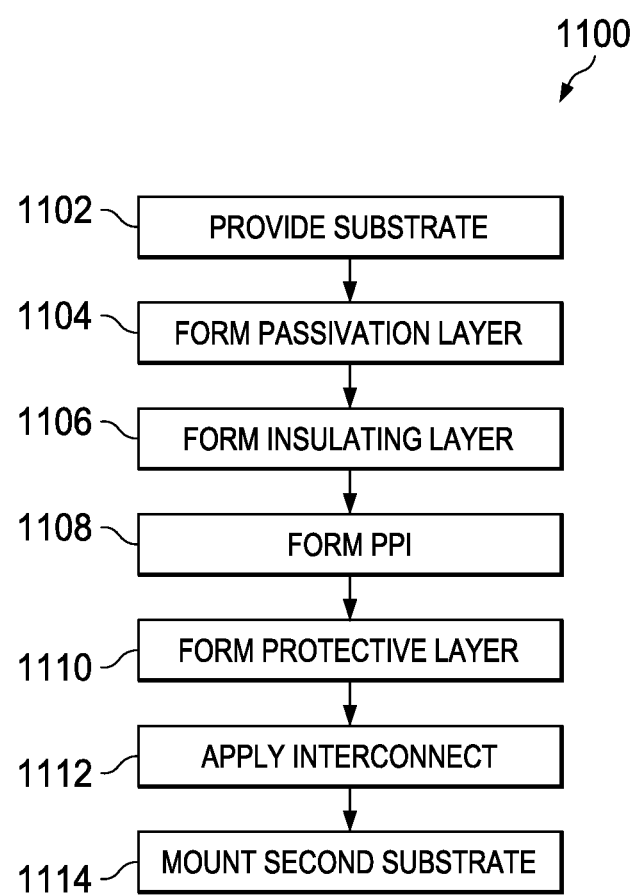
FIG. 11 is a flow diagram illustrating a method for forming an interconnect according to an embodiment.

FIG. 11 is a flow diagram illustrating a method 1100 for forming an interconnect according to an embodiment. A substrate may be provided in block 1102. A land may be disposed on the body of the substrate, and the land may be electrically connected to one or more active devices on the land. A passivation layer may be formed over the substrate in block 1104. The passivation layer may extend over a portion of the land. An insulation layer may be formed in block 1106. A mask may be formed to pattern the insulation layer to create an opening around at least a portion of the land and over a portion the passivation layer. A PPI layer may be formed in block 1108. The PPI layer may be formed on a portion of the land and may extend onto a portion of the passivation layer. The PPI may have a PPI contact portion with a portion contacting the land. The PPI contact portion may avoid overlying the insulation layer. A protective layer may be formed in block 1110. The protective layer may overlie the insulation layer and a portion of the PPI. The insulation layer may expose a portion of the PPI and an interconnect may be applied to the PPI in block 1112. A second substrate may be mounted on the interconnect in block 1114.

An embodiment of a method of forming an interconnect comprises forming a passivation layer over a substrate and over a portion of a land disposed on a substrate and forming an insulation layer over the passivation layer and having an opening exposing at least a portion of the passivation layer. A PPI is formed over the substrate, with a portion of the PPI disposed over at least a portion of the insulation layer. The PPI comprises a PPI contact portion disposed over the land without an intervening portion of the insulation layer between the PPI contact portion and the land. A portion of the PPI contact portion in electrical contact with the land. A protective layer is formed over at least a portion of the PPI, the protective layer having a thickness over the PPI contact portion of at least about 7 µm. Forming the insulation layer optionally comprises forming the insulation layer with a sidewall of the opening aligned substantially over an edge of the land. In an embodiment, the PPI contact portion may be formed with a sidewall in contact with a sidewall of the opening in the insulation layer. In another embodiment, the PPI contact portion is formed with a sidewall in spaced apart from a sidewall of the opening in the insulation layer.

According to an embodiment, an interconnect device comprises a substrate having a land disposed thereon and a passivation layer disposed over the substrate and over a portion of the land. An insulation layer is disposed over the substrate and has an opening disposed over at least a portion of the land. A conductive layer is disposed over a portion of the passivation layer and in electrical contact with the land. The conductive layer has a portion extending over at least a portion of the insulation layer. The conductive layer comprises a contact portion disposed over at least a portion of the land. The insulation layer avoids extending between the land and the contact portion. A protective layer may be disposed over at least a portion of the conductive layer and may optionally have a thickness of at least 7 µm.

A sidewall of the opening in the insulation layer may be aligned substantially over an edge of the land and a sidewall of the contact portion may be in contact with the sidewall of the opening in the insulation layer. A sidewall of the contact portion may be spaced apart from the sidewall of the opening in the insulation layer and a sidewall of the opening in the insulation layer may be aligned substantially outside of an edge of the land. A sidewall of the opening in the insulation layer may be aligned substantially outside the edge of the land and a sidewall of the opening in the insulation layer may be aligned substantially over a body of the land.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, and composition of matter, means, methods or steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A device comprising:
a substrate having a land disposed thereon;
a passivation layer disposed over the substrate and over the land, the passivation layer having a first opening exposing a portion of the land;
an insulation layer disposed over at least a portion of the passivation layer and having a second opening disposed over the land and exposing a surface of the passivation layer disposed outside the first opening and facing away from the substrate; and
a conductive layer disposed over and contacting the surface of the passivation layer exposed by the second opening, the conductive layer in electrical contact with the land, the conductive layer having a portion extending over at least a portion of the insulation layer, the conductive layer having an outermost edge disposed in the second opening and over the passivation layer, the conductive layer having a contact portion between the outermost edge and the portion extending over the insulation layer, the contact portion disposed over at least a portion of the land; and
a protective layer disposed over at least a portion of the conductive layer, wherein the insulation layer avoids extending beneath the outermost edge of the conductive layer, and wherein the protective layer has a thickness over the contact portion of at least about 7 μm.

2. The device of claim 1, wherein a sidewall of the second opening is aligned substantially over an edge of the land.

3. The device of claim 2, wherein the outermost edge of the conductive layer is in contact with the sidewall of the second opening.

4. The device of claim 2, wherein the outermost edge of the conductive layer is spaced apart from the sidewall of the second opening.

5. The device of claim 1, wherein a sidewall of the second opening is aligned substantially outside of an edge of the land.

6. The device of claim 5, wherein the outermost edge of the conductive layer is aligned substantially outside the edge of the land.

7. The device of claim 5, wherein the outermost edge of the conductive layer is aligned substantially over a body of the land.

8. A device comprising:
a passivation layer disposed over a substrate having a land disposed therein, the passivation layer extending over a portion of the land, wherein a first surface of the passivation layer physically contacts an upper surface of the land;
an insulation layer disposed over the substrate and having an opening disposed over at least a portion of the land, wherein a second surface of the passivation layer opposite the first surface is free from the insulation layer;
a post passivation interconnect (PPI) layer disposed over a portion of the passivation layer, the PPI layer having a first outermost edge, a second outermost edge opposite the first outermost edge, and a post passivation interconnect (PPI) contact portion between the first outermost edge and the second outermost edge, wherein the first outermost edge is an edge of a portion of the PPI layer extending over at least a portion of the insulation layer, wherein the PPI contact portion is disposed in the opening of the insulation layer and over at least a portion of the land, wherein the second outermost edge is disposed in the opening of the insulation layer and over the passivation layer, wherein the second outermost edge avoids overlying the insulation layer; and
a protective layer disposed over at least a portion of the PPI layer, wherein the protective layer has a thickness over the PPI contact portion of at least about 7 μm.

9. The device of claim 8, wherein the protective layer has a thickness over the PPI contact portion of about 8.5 μm.

10. The device of claim 8, further comprising an interconnect disposed on the portion of the PPI layer extending over the insulation layer.

11. The device of claim 8, wherein the second outermost edge is aligned substantially over an edge of the land.

12. The device of claim 8, wherein the PPI layer is formed from copper.

13. A device comprising:
a passivation layer disposed over a substrate and extending over a portion of a top surface of a land disposed on the substrate;
an insulation layer disposed over the passivation layer, the insulation layer having first sidewalls forming an opening exposing at least a portion of the land and at least a portion of a top surface of the passivation layer;
a conductive layer disposed over the passivation layer, the conductive layer having a portion extending over at least a portion of the insulation layer, the conductive layer comprising a contact portion disposed in the opening and in electrical contact with the land, the contact portion having second sidewalls disposed in the opening and over the passivation layer, wherein one of the second sidewalls comprises an outermost edge of the conductive layer, wherein no portion of the insulation layer is disposed beneath the outermost edge of the conductive layer, and wherein the first sidewalls are disposed outside of the second sidewalls;
an interconnect disposed on the portion of the conductive layer extending over the insulation layer; and
a protective layer disposed over at least a portion of the conductive layer, wherein a portion of the protective layer is disposed beneath a peripheral portion of the interconnect.

14. The device of claim 13, wherein the first sidewalls are spaced apart from the second sidewalls, and wherein a portion of the protection layer extends between the first sidewalls and the second sidewalls.

15. The device of claim 14, wherein the first sidewalls are aligned outside of a region aligned directly over the land; and wherein the second sidewalls are aligned directly over the land.

16. The device of claim 13, wherein the contact portion contacts the passivation layer outside of a region aligned directly over the land.

* * * * *